United States Patent [19]

Ronan, Jr. et al.

[11] Patent Number: 4,677,324
[45] Date of Patent: Jun. 30, 1987

[54] FAST SWITCH-OFF CIRCUIT FOR CONDUCTIVITY MODULATED FIELD EFFECT TRANSISTOR

[75] Inventors: Harold R. Ronan, Jr.; Carl F. Wheatley, Jr., both of Luzerne County, Pa.

[73] Assignee: RCA Corporation, Somerville, N.J.

[21] Appl. No.: 842,651

[22] Filed: Mar. 21, 1986

[51] Int. Cl.$^4$ .................. H03K 17/687; H03K 3/33; H03K 3/353; H03K 17/56
[52] U.S. Cl. .................. 307/571; 307/300; 307/304; 307/246; 307/450; 307/247.1; 357/43
[58] Field of Search ............ 307/304, 450, 570–571, 307/581, 246, 597, 575, 247 R, 300; 357/43

[56] References Cited

U.S. PATENT DOCUMENTS 4,551,643 11/1985 Russell et al. .................. 307/570

OTHER PUBLICATIONS

C. Frank Wheatley, Jr., and Gary M. Dolny, "COMFET—The Ultimate Power Device; A General Study of Power Devices", *Solid State Technology*, Nov. 1985, pp. 121–128.

*Primary Examiner*—Stanley D. Miller
*Assistant Examiner*—M. R. Wambach
*Attorney, Agent, or Firm*—Joseph S. Tripoli; Allen L. Limberg

[57] ABSTRACT

A fast switch-off circuit for a conductivity modulated field effect transistor (COMFET) avoids the flow of destructive latch-up currents. A reduced-amplitude switch-off current is applied to the gate electrode of the COMFET during the initial portion of switch-off. When the source-to-drain voltage ($V_{DS}$) of the COMFET has become larger than the range of low $V_{DS}$ voltage in which latch-up can occur for an increased-amplitude switch-off current being applied to the gate electrode of the COMFET, that increased-amplitude switch-off current is applied to the gate electrode of the COMFET.

18 Claims, 6 Drawing Figures

COMFET EQUIVALENT CIRCUIT

FAST SWITCH-OFF CIRCUIT FOR CONDUCTIVITY MODULATED FIELD EFFECT TRANSISTOR

The invention relates to switching off conduction through the source to drain paths of conductivity modulated field effect transistors, or COMFETs.

BACKGROUND OF THE INVENTION

C. F. Wheatley, Jr. and G. M. Dolny provide a general background description of the COMFET in their article "COMFET—The Ultimate Power Device; A General Study of Power Devices" on pages 121–128 of the November 1985 issue of SOLID STATE TECHNOLOGY. This article is incorporated herein by reference.

The COMFET has an insulated gate control electrode, which reduces the power required of the input circuitry, generally allowing that circuitry to be simplified. However, the source-to-drain circuit is like the emitter-to-collector circuit of a bipolar transistor, permitting conduction at current densities of several hundred amperes per square centimeter while forward voltage drop from source-to-drain is only a volt or so. This low forward voltage drop is available at high current densities because of the presence of minority carriers which conductivity modulate the high-resistance epitaxial layer forming the anode region. Such a device offers only medium switching speeds (in the order of fractions of milliseconds) with a switch-off tail caused by slow minority carrier recombination. Furthermore, there is an undesirable tendency for latch up to occur in a parasitic silicon-controlled rectifier in the COMFET structure.

To reduce the power loss during switching, it is desirable to switch the COMFET on and off at as high speed as possible. Faster switching is obtained by driving the gate of the COMFET from a voltage source with low internal resistance, so the RC time constant of that resistance times the gate capacitance of the COMFET is shortened. At these higher switching speeds the COMFETs undesirably show a tendency towards latch-up and consequent loss of control by voltage applied to the gate electrode. Unless the energy available to the COMFET during latch-up is carefully limited, latch-up results in destruction of the device.

SUMMARY OF THE INVENTION

Switching the COMFET to provide essentially short-circuit conduction between source and drain is not accompanied by any latch-up problem, no matter what the speed of switch-on, the present inventors find. The present inventors find that latch-up can occur only when rapidly switching the COMFET off with the objective of providing an essentially open circuit between source and drain. Further, the present inventors find that latch-up is most likely to occur when source-to-drain voltage $V_{DS}$ is small, and may occur even when its derivative with time $d(V_{DS})/dt$ is quite small.

Based on their findings, the present inventors have constructed fast switch-off circuitry for the COMFET which avoids latch-up. In this circuitry a reduced-amplitude switch-off current is initially supplied to the gate electrode of the COMFET. Thereafter, when the potential between the source and drain electrodes of the COMFET has risen to a value for which latch-up would not occur if an increased-amplitude switch-off current were applied to the COMFET gate electrode, that increased-amplitude switch-off current is applied to the COMFET gate electrode to speed up its switching to non-conduction. In preferred embodiments of this invention the amplitude of the potential between the source and drain electrodes of the COMFET is sensed to control the application of increased switch-off current.

BRIEF DESCRIPTION OF THE DRAWING

FIGS. 2 and 3 are schematic diagrams of test circuitry the present inventors used to determine that latch-up occurs during switch-off rather than during switch-on.

DETAILED DESCRIPTION

Figure 1:
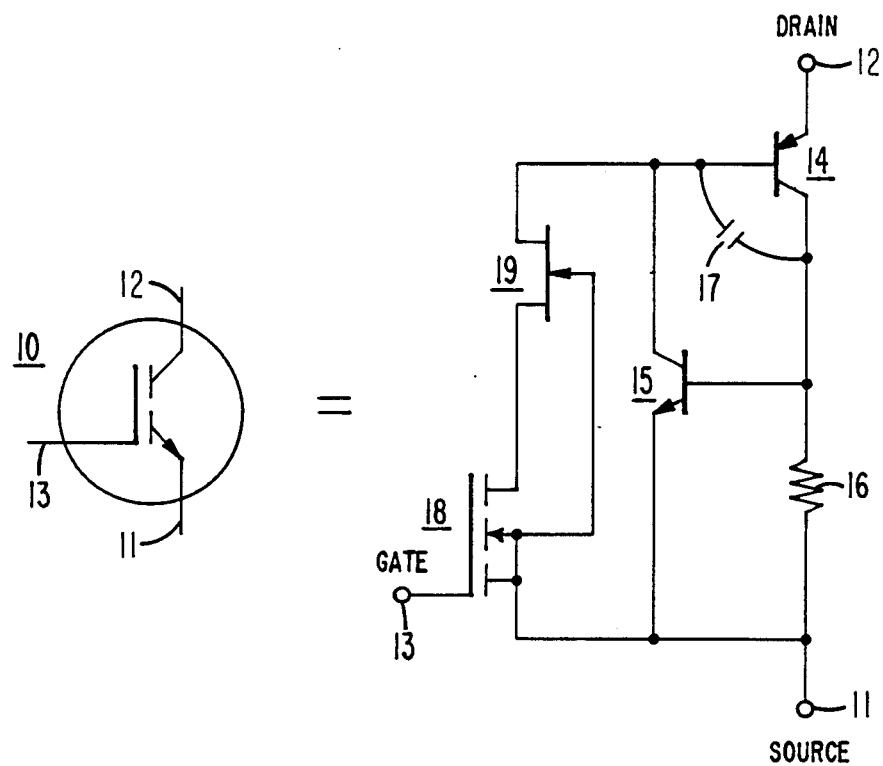
FIG. 1 is a schematic diagram of the equivalent circuit of the COMFET in terms of simpler and more familiar elements.

FIG. 1 shows an equivalent circuit for the COMFET 10. The COMFET 10 has a source connection 11, a drain connection 12, and a gate connection 13. Its structure is similar to a n-channel vertical-structure metal-oxide semiconductor field effect transistor (MOSFET) with the n drain region adjoined by a p+ epitaxial layer that functions as the anode region. This anode region, which is ohmically contacted and connected to the drain connection 12 of COMFET 10, is the emitter region of a p-n-p bipolar transistor equivalent 14. The collector of p-n-p bipolar transistor equivalent 14 connects to the base of an n-p-n bipolar transistor equivalent 15, the emitter region of which is ohmically contacted and connected to source connection 11 of COMFET 10. The collector of n-p-n bipolar transistor equivalent 15 connects to the base of p-n-p bipolar transistor equivalent 14 completing a regenerative latch circuit configuration that is the equivalent circuit of a silicon controlled rectifier. Latch-up, or silicon-controlled-rectifier action, is avoided by shunting the base-emitter junction of n-p-n bipolar transistor equivalent 15 with a sufficiently large conductance 16. The voltage drop across conductance 16, responsive to the flow of p-n-p bipolar transistor 14 collector current therethrough, is insufficiently large to forward bias the base-emitter junction of n-p-n bipolar transistor equivalent 15, as long as current through source connection 11 does not exceed specified limits.

When bipolar transistor equivalent 14 and 15 are rendered highly conductive, the voltage between source connection 11 and drain connection 12 is brought down to substantially equal the voltage drop of conductance 16 and the emitter-to-collector saturation voltage ($V_{SAT}$) of transistor equivalent 14. This is accompanied by discharge of the equivalent collector-to-base capacitance 17 of p-n-p bipolar transistor equivalent 14. Capacitance 17 is not fixed-value, but becomes larger when the collector-to-base voltage of p-n-p bipolar transistor equivalent 14 does not strongly reverse bias its collector-base junction.

When conduction in the emitter-to-collector path of p-n-p bipolar transistor equivalent 14 is abruptly shut off, displacement current flows to recharge capacitance 17. This displacement current is initially larger, because of capacitance 17 being larger when the collector-base junction of p-n-p transistor equivalent 14 is not strongly reverse-biased. This displacement current generates a dynamic component of voltage drop across conductance 16 that augments the static voltage drop thereacross. The total voltage drop across conductance 16 may undesirably be large enough to forward-bias the base-emitter junction of n-p-n bipolar transistor equivalent 15. Should this occur, the regenerative loop connection of bipolar transistor equivalents 14 and 15 will latch up. This is the latch-up condition the present invention seeks to forestall.

The vertical-structure power MOSFET in actuality is a cascode connection of an enhancement-mode n-channel MOSFET equivalent 18 and a depletion-mode, vertical-structure, n-channel junction-isolated-gate field effect transistor (JFET) equivalent 19. The gate electrode of MOSFET equivalent 18 is the gate connection 13 of COMFET 10. The source region of MOSFET equivalent 18 is the same n+ region as the emitter region of n-p-n bipolar transistor equivalent 15, which as noted previously is ohmically contacted and connected to source connection 11. This n+ region is surrounded by an isolating p region. The gate region of the JFET equivalent 19 is a portion of this p region which is ohmically contacted and connected to source connection 11. The drain region of MOSFET equivalent 18 is the same as the source region of JFET equivalent 19 and is an electrostatically induced n region formed from a sheet of electrons at the surface of the n-epitaxial region next to the isolating p region. This electrostatically induced n region is held close to the potential at source connection 11 by the source-follower action of JFET equivalent 19. This permits MOSFET equivalent 18 to be a small-channel-length device without fear of a large voltage between source connection 11 and drain connection 12 causing over-dissipation and consequent destruction of MOSFET equivalent 18. The drain region of JFET equivalent 19 is the same n region as the base region of p-n-p bipolar transistor equivalent 14. This n region is held within one $V_{BE}$ of the drain connection 12 potential by its rectifying connection to the p+ anode region. This anode region is the emitter region of p-n-p bipolar transistor equivalent 14 and is ohmically contacted for connection to drain connection 12.

Experiments were made by the present inventors to investigate the phenomenon of latch-up. The results of these experiments tend to confirm the present inventors' suspicion that displacement current flow during the re-charging of capacitance 17 increases the voltage drop across conductance 16 to cause latch-up of the silicon controlled rectifier connection of bipolar transistor equivalents 14 and 15. Test circuitry was used that was similar to that shown in FIGS. 2 and 3 except for the current rectifying diode 20 not being included. In this test circuitry grounded-source COMFET 10 was provided with a resistive load 21 connecting its drain to a source of operating potential, $V_{DD}$. While latch-up is normally destructive of a COMFET, if the energy available to support current flows during latch-up is closely constrained, destruction can be avoided though latch-up occur. This facilitates investigation of latch-up being made. A gate-drive resistance comprising serial portions 22 and 23 was connected between a gate drive signal voltage source 24 and COMFET 10 Source 24 supplies positive voltage when COMFET 10 is to be turned on, or placed into conduction, and a zero-valued voltage when COMFET 10 is to be turned off, or removed from conduction. "Responsive to source 24 applying positive voltage to the gate connection of COMFET 10, switch-on current flows from source 24 into the gate connection of COMFET 10 to change its gate capacitance. When source 24 voltage returns to zero value, switch-off current flows from the gate connection of COMFET 10 to source 24 to discharge the gate capacitance of COMFET 10. (These polarities of voltage and current are for COMFET 10 being an n-channel device, as illustrated; for a p-channel device the polarities will be the reverse of those described. Various values of this gate-drive resistance and of drain-load resistance 21 were employed in an initial investigation. The onset of latch-up appeared to be slightly more apt to occur if gate-drive resistance (22+23) were decreased and to be slightly less apt to occur if drain load resistance 21 were increased. This suggests the onset of latch-up is slightly less likely to occur if $d(V_{DS})/dt$ is kept smaller.

Figure 2:
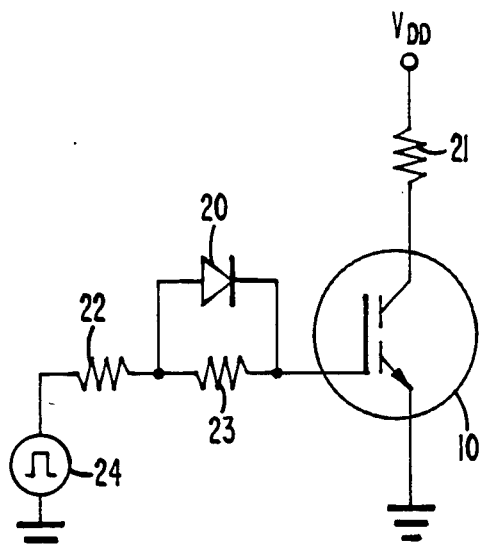

The test circuitry was then modified as shown in FIG. 2 by shunting a portion 23 of the gate-drive resistance with the current rectifying diode 20 poled as shown. In the FIG. 2 circuit the addition of diode 20 had no effect on the onset of latch-up. Diode 20 could change the behavior of the circuit only during switch-on, when diode 20 conducts to shunt the portion 23 of gate-drive resistance. So latch-up was found not to be linked with switch-on of COMFET 10.

Figure 3:
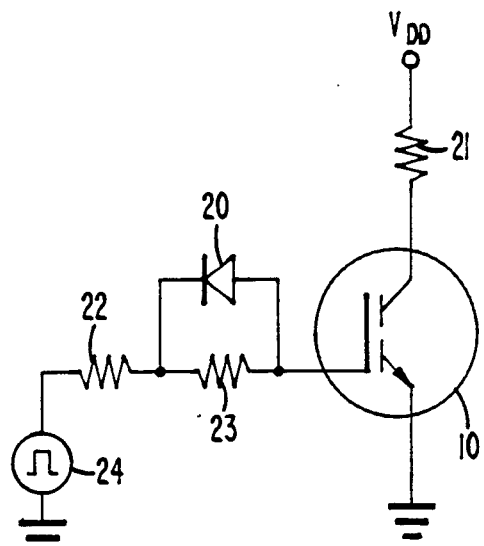

The modification of the test circuitry was then changed by reversing the poling of the current rectifying diode 20 per FIG. 3. The addition of diode 20 in this poling, where it can conduct only during switch-off to modify the original test circuit, made the onset of latch-up more likely to occur.

This confirmed that latch-up is associated with switch-off of COMFET 10.

Figure 4:
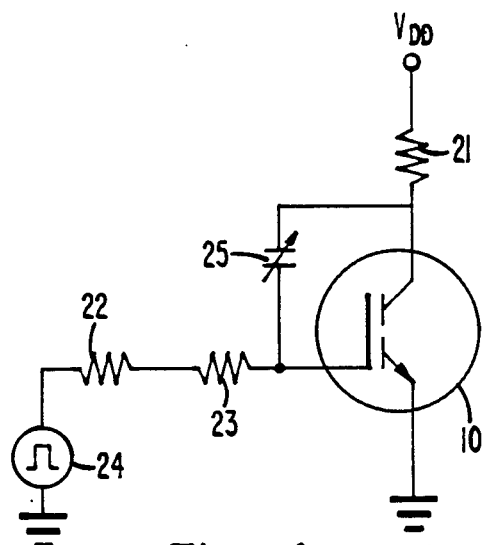
FIG. 4 is a schematic diagram of test circuitry the present inventors used to determine that latch-up occurs at low values of source-to-drain voltage.

To test the sensitivity of latch-off to $d(V_{DS})/dt$ a variable capacitance 25 was added to the original test circuitry, per FIG. 4. The set of conditions needed for latch-up to occur was then determined by oscilloscopic observation of $V_{DS}$. The onset of latch-up was found to be independent of the fast increasing portion of $V_{DS}$. That is, latch-up was observed to be essentially unaffected by the value of capacitance 25. The inventors concluded (presuming their prior observations were valid) that latch-up must occur during turn-off, while $V_{DS}$ is still small in value and there is an accompanying $d(V_{DS})/dt$, even though that $d(V_{DS})/dt$ is comparatively quite low.

Figure 5:
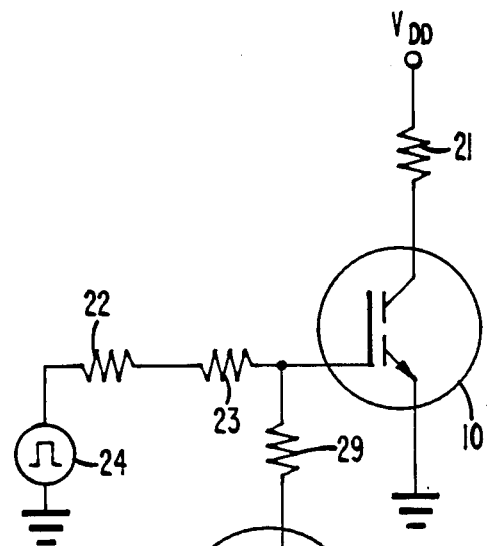
FIG. 5 is a schematic diagram of test circuitry used to determine a relationship between latch current and the source-to-drain voltage at which latch-up first occurs which test circuitry can be operated so as to embody the invention.
Figure 5:
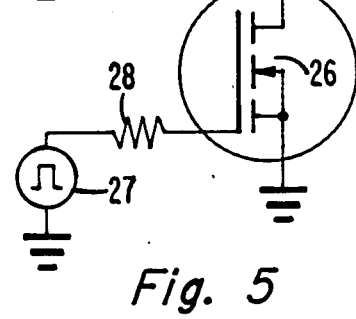

To test this conclusion, the original test circuit was modified to the one shown in FIG. 5. The MOSFET 26 is switched on by a positive-going drive signal supplied to its gate electrode via resistor 28 from an auxiliary gate-drive-signal voltage source 27. The positive-going transition of this drive signal occurs with adjustable delay after the negative-going transition of the drive signal is supplied from voltage source 24 to switch-off COMFET 10. Accordingly, COMFET 10 may be driven into non-conduction by the gate-drive-signal voltage source 24 via gate-drive resistance (22+23) until $V_{DS}$ has increased sufficiently to get past the range of low $V_{DS}$ in which latch-up is likely. Then, with MOSFET 26 being switched into conduction, gate-drive signal is applied to COMFET 10 through a substantially lower gate-drive resistance, as provided by resistor 29. The provision of the additional, lower-resistance path for turn-off current through resistor 29 and the drain-to-source conduction path of MOSFET 26 lowers the conductance from COMFET 10 gate electrode to ground. Consequently, there is an increase in the amplitude of the turn-off current flow, as charge is swept out of COMFET 10 through its gate electrode. Using this FIG. 5 testing circuitry it can be shown that the rendering of MOSFET 26 conductive at the instant COMFET 10 $V_{DS}$ reaches a given value produces a given latch-up current.

The inventors have interpreted these test results to indicate that a COMFET can be more rapidly switched-off while avoiding destructive latch-up, as follows. Means are provided for initially applying a reduced-amplitude switch-off current to the COMFET gate electrode. Means are also provided for subsequently applying increased-amplitude switch-off current to the COMFET gate electrode, after the $V_{DS}$ of the COMFET is sufficiently large to be out of the range of $V_{DS}$ where latch-up can occur with that increased-amplitude switch-off current. FIG. 5 provides both the means for initially applying a reduced-amplitude switch-off current and the means for subsequently applying increased amplitude switch-off current.

This latter means can be one that operates without prior knowledge of the rise-time characteristics of $V_{DS}$ for any particular drain load on the COMFET. Consider the following way to do this. Means are provided which respond to a control signal to selectively apply the increased-amplitude switch-off current to the COMFET gate electrode. Means for sensing when the COMFET $V_{DS}$ is substantially larger than any $V_{DS}$ at which latch-up is likely to occur for that increased-amplitude switch-off current, are used to generate the control signal.

Figure 6:
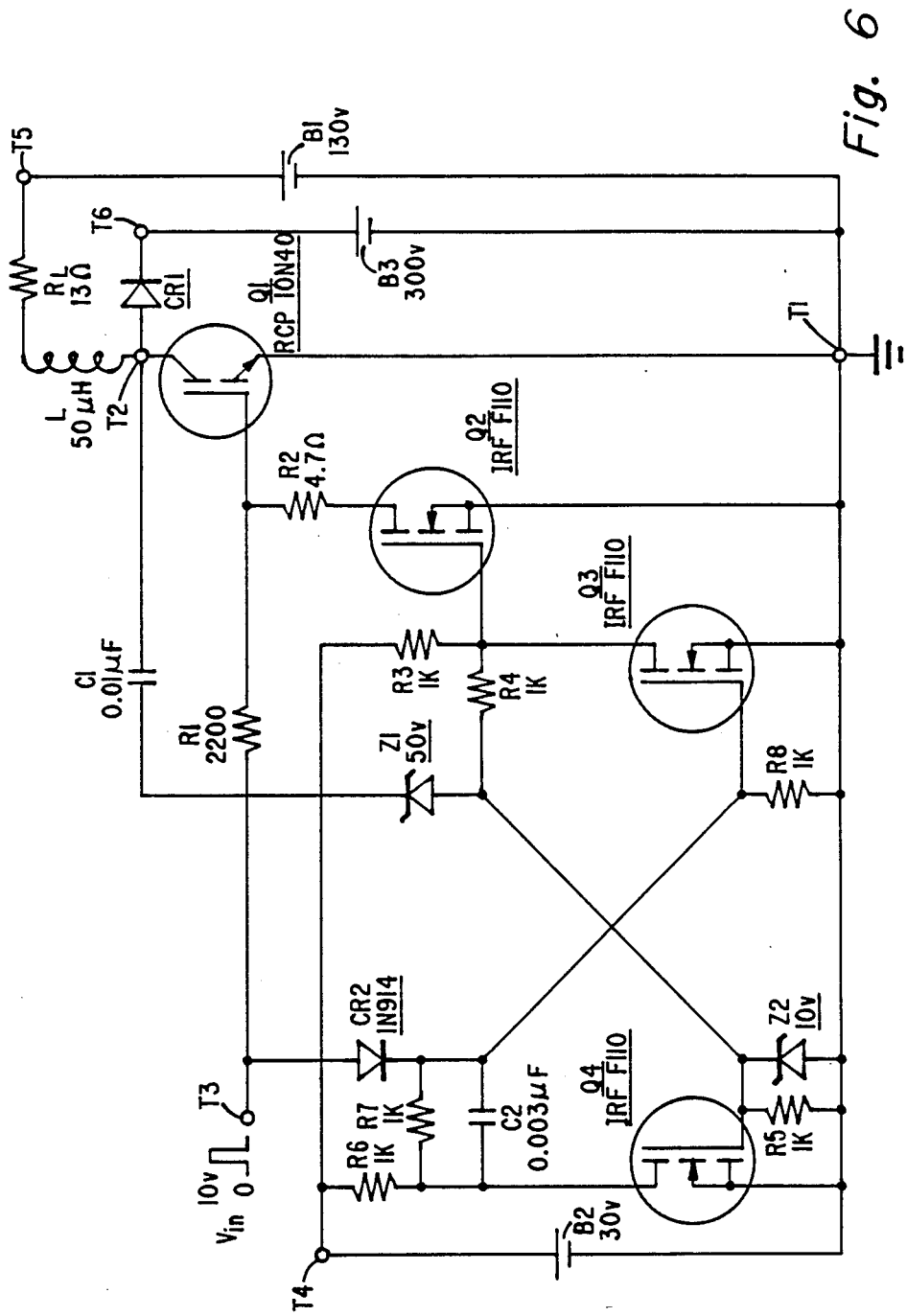
FIG. 6 is a schematic diagram of a fast switch-off circuit for a COMFET, which circuit embodies the invention.

FIG. 6 augments circuitry of the type shown in FIG. 5 with specific circuitry of the type described generally in the preceding paragraph. A COMFET Q1 has source and drain connections to first and second terminals T1 and T2, respectively. Terminal T1 is shown as being grounded. The negative terminals of a principal operating voltage supply B1, an auxiliary operating voltage supply B2 and a clamp voltage supply B3 connect to terminal T1. A third terminal T3 receives a voltage $V_{IN}$, which is switched between a ground-valued switch-off level and a positive-valued switch-on level for controlling conduction in COMFET Q1. An auxiliary operating supply has its positive terminal connected to a fourth terminal T4. The drain load for Q1 is shown as the series combination of a load resistance $R_L$ and load inductance L, connecting between the second terminal T2 and a fifth terminal T5 to which the positive terminal of the principal operating voltage supply B1 connects. This drain load is the equivalent of the input circuit of a flyback transformer in a television receiver, for example. A flyback transformer operates as an inductor, storing energy when its drive transistor is conductive to cause current flow through its primary winding and a resultant build-up of the electromagnetic field surrounding the transformer windings. Then, when its driver transistor is no longer conductive, the flyback transformer releases its stored energy, attempting to continue current flow through its windings as the built-up field wanes in strength or "collapses". Inductor L corresponds to the inductance of a flyback transformer, as referred to its primary winding. The flyback voltage generated by the field surrounding inductor L collapsing when Q1 is switched off is kept from applying excessive $V_{DS}$ to Q1. To do this, terminal T2 is clamped by forward conduction of a current rectifier diode CR1 connecting to a sixth terminal T6, receptive of clamp voltage supplied by the positive terminal of clamp voltage supply B3.

In FIG. 6 COMFET Q1 and a MOSFET Q2 correspond essentially to elements 10 and 26 in FIG. 5. A resistor R1 in FIG. 6 corresponds essentially to the series combination of resistors 22 and 23 in FIG. 5. The resistor 29 of FIG. 5 is essentially corresponded to by a resistor R2 in FIG. 6.

The description of the operation of the FIG. 6 circuit which follows assumes COMFET Q1 initially to be non-conductive between its source and drain. The voltage $V_{IN}$ applied at the third terminal T3 is at ground potential and is applied through resistor R1 having relatively large resistance as compared to resistor R2. R2 and the drain-to-source path of MOSFET Q2, which is conductive, clamp the gate electrode of Q1 to the ground potential at terminal T1. Q2 is held in conduction by voltage divider action between a resistance R3 and the serial connection of resistances R4 and R5, dividing down the auxiliary operating voltage applied to terimal T4. This voltage divider action obtains because a MOSFET Q3 having its source connection to T1 and its drain connection to Q2 gate is non-conductive. Voltage divider action between R5 and the serial connection of R3 and R4 applies a fraction of the auxiliary operating potential at terminal T4 to the gate of another MOSFET Q4, which fraction is sufficiently large to bias Q4 into condition.

If Q4 were not conductive, resistive potential divider action between a resistor R8 and the serial connection of resistor R6 and R7 would apply a fraction of the auxiliary operating potential at terminal T4 to Q3 gate, which fraction would be sufficiently large to bias Q3 into conduction. The conduction of Q4, however, clamps the node to which its drain and the ends of R6 and R7 connect to the ground potential applied to Q4 source via terminal T1. Consequently, Q3 gate is held to ground by conduction through R7 and through resistor R8, which biases Q3 for non-conduction.

One skilled in the art of circuit design will perceive Q3 and Q4 are in a flip-flop connection which has only two stable states: that in which Q3 is conductive and Q4 is non-conductive, and that in which Q4 is conductive and Q3 is non-conductive. This is because the cross-coupled drain-to-gate connections of Q3 and Q4 providing regenerative flyback that makes simultaneous conduction of Q3 and Q4 an unstable operating state.

When $V_{IN}$ is switched to the positive level responsive to which level COMFET Q1 is to be switched into conduction, the flip-flop connection of Q3 and Q4 is forced into the stable operating condition in which Q3 is conductive and Q4 is non-conductive. A current rectifier diode CR2 forward-conducts to raise Q3 gate potential to $V_{IN}$ positive level minus the CR2 offset voltage. Since Q4 drain-to-source path is conductive, to establish clamp to ground potential at the Q4 drain connection to one plate of a capacitor C2, C2 is charged by $V_{IN}$ swinging positive towards the threshold voltage of Q3. Responsive to Q3 gate potential increase, Q3 drain-to-source path becomes conductive, pulling the node between R3 and R4 towards the ground potential applied to Q3 source electrode via terminal T1. This reduces the forward gate bias on Q4 reducing its conduction. As Q4 drain is pulled toward the auxiliary operating voltage at terminal T4 by the lessening voltage drop across R6, charging of C2 is discontinued. The rising drain potential of Q4 as applied through C2, augmented by the additional positive voltage appearing across C2 due to its previous charging, drives Q3 harder into conduction. The flip-flop connection of Q3 and Q4 rapidly changes to the other one of its stable operating states, with Q3 on and Q4 off.

With Q3 in conduction to clamp its drain to the ground potential applied to its source via terminal T1, Q2 gate receives no forward bias potential. So Q2 is non-conductive and the clamp of Q1 gate electrode to the ground potential at terminal T1 via R2 a conductive Q2 is discontinued. The potential divider action between R1 and R2, which previously greatly attenuated $V_{IN}$ application to Q1 gate, is discontinued.

The full positive switch-on level of $V_{IN}$ is applied to Q1 gate via the relatively high gate-drive impedance afforded by R1. Q1 switches into conduction. The change in its drain voltage displacement current flow through capacitor C1 to forward-bias the avalanche diodes Z1 and Z2. The forward conduction of Z2 prevents the gate electrodes of Q2 and Q4 being driven so far below ground potential as to overstress their gate insulation.

At a subsequent time, $V_{IN}$ is returned to ground level, responsive to which COMFET Q1 is to be switched off. Forward conduction through CR2 stops. Potential divider action between resistor R8 and the series connection of resistors R6 and R7 applies to Q3 gate a fraction of the auxiliary operating voltage at terminal T4. (CR2 reverse breakdown voltage is higher than this fraction of auxiliary operating potential, so CR2 exhibits no reverse conduction.) The potential applied to its gate maintains Q3 in conduction. Since Q3 drain is still clamped to ground, Q2 gate is close to ground to keep Q2 non-conductive. The switch-off voltage level at terminal T3 is applied to COMFET Q1 through resistor R1. The RC time constant of this gate-drive resistance with Q1 gate capacitance is relatively long, so Q1 initial switch-off is slowed. The rate at which the collector-to-base capacitance of the p-n-p transistor equivalent in Q1 is recharged is kept sufficiently slow that displacement current through the capacitance is not large enough to initiate SCR action, which would result in latch-up.

The change in Q1 $V_{DS}$ is applied to the cathode of a fifty-volt-breakdown avalanche diode Z1. As long as Q1 $V_{DS}$ is less than fifty volts Z1 is insufficiently reverse-based to exhibit avalanche breakdown. As $V_{DS}$ rises above fifty volts, Z1 exhibits avalanche breakdown; and the further increase in Q1 $V_{DS}$ applies forward gate potential increase to Q4. Q4 source-to-drain path becomes conductive, clamping its drain to its source, which connects via terminal T1 to ground. Capacitor C2 is a speed up capacitor causing the full drain swing of Q4, as it switches on, to be applied as reverse potential to Q3 gate. This switches Q3 out of conduction and toggles the flip-flop connection of Q3 and Q4 to its other stable operating condition where Q4 is conductive and Q3 is non-conductive.

With Q3 driven out of conduction, R3 pulls up Q2 gate potential towards the auxiliary operating voltage in terminal T4. Q2 source-to-drain path becomes highly conductive, responsive to this increase in Q2 gate potential. Q1 gate is clamped to ground through the low resistance of Q2 source-to-drain path in series with R2. The RC time constant of this gate-drive resistance with Q1 gate capacitance is short, so the switch-off Q1 continues at more rapid rate in accordance with the precepts of the invention.

As Q1 $V_{DS}$ soars, avalanche diode Z2 is biased into avalanche breakdown, to restrain gate potential on Q4 from becioming excessive. As the rate of $V_{DS}$ change slows, or as $V_{DS}$ change is halted by CR1 being forward biased into clamp, the displacement current through C1 is curtailed. So diode Z1 and Z2 are no longer maintained in avalanche breakdown. Q4 gate is still forward biased, however, by voltage divider action between R5 and the series connection of R3 and R4. So, Q4 remains conductive, and Q3 remains non-conductive. With Q3 not being conductive, voltage divider action between R3 and the series connection of R4 and R5 maintains forward bias on Q2 gate to keep it conductive. The operating conditions return to those initially assumed at the beginning of the description of the FIG. 6 circuit.

What is claimed is:

1. A fast switch-off circuit for a conductivity modulated field effect transistor, said conductivity modulated field effect transistor having source and drain and gate electrodes, said conductivity modulated field effect transistors being prone to latch-up when a switch-off current of more than a given absolute value of amplitude is supplied to its gate electrode when its drain voltage is close to its source voltage, said fast switch-off circuit comprising:

means for initially supplying a switch-off current smaller than said given amplitude to the gate electrode of said conductivity modulated field effect transistor; and means for supplying, after a time duration sufficient for the potential between the source and drain electrodes to reach an amplitude for which latch-up would not occur if a switch-off current larger than said given amplitude were supplied to the gate electrode, said switch-off current larger than said given amplitude to the gate electrode of said conductivity modulated field effect transistor.

2. A fast switch-off circuit as set forth in claim 1 wherein said means for supplying said switch-off current larger than said given amplitude to the gate electrode of said conductivity modulated field effect transistor comprises:

means for sensing when the amplitude of the potential between the source and drain electrodes of said conductivity modulated field effect transistor reaches a prescribed amplitude; and means for supplying said switch-off current larger than said given amplitude to the gate electrode of said conductivity modulated field effect transistor responsive to said prescribed amplitude being reached.

3. In combination:

a first transistor which is of conductivity modulated field effect type and has source, drain and gate electrodes;

a first terminal to which the source electrode of said first transistor connects;

a second terminal to which the drain electrode of said first transistor connects;

a third terminal between which third terminal and said first terminal an input drive signal voltage is applied;

a first resistance connected between said third terminal and the gate electrode of said first transistor;

means for supplying source-to-drain voltage and load impedance for said first transistor, which means is connected between said first and second terminals;

a fast switch-off circuit comprising the following elements;

second, third and fourth transistors, each having a respective principal current conduction path between a respective first electrode thereof and a respective second electrode thereof, the conductance of which principal current conduction path is controlled responsive to voltage applied between the first electrode of that transistor and a third electrode thereof exceeding a threshold value;

connections of the first electrodes of said second, third and fourth transistors to said first terminal;

a second resistance connected between the gate electrode of said first transistor and the second electrode of said second transistor;

means, responsive to non-conduction between the first and second electrodes of said third transistor, for applying between the first and third electrodes of each of said second and fourth transistors voltages sufficiently large to cause each to conduct between its first and second electrodes;

means, responsive to non-conduction between the first and second electrodes of said fourth transistor, for applying between said first and third electrodes of said third transistor a voltage sufficiently large to cause said third transistor to conduct between its first and second electrodes;

means, responsive to said input drive signal voltage being of a level for switching on conduction between the source and drain electrodes of said first transistor, for applying between the first and third electrodes of said third transistor a voltage sufficiently large to cause said third transistor to conduct between its first and second electrodes; and means, responsive to the potential between said first and second terminals exceeding a prescribed value, for applying between the first and third electrodes of said fourth transistor a voltage sufficiently large to cause said fourth transistor to conduct between its first and second electrodes.

4. A combination as set forth in claim 3 wherein said second, third and fourth transistors are all enhancement-mode field effect transistors, the first electrode of each being its source electrode, the second electrode of each being its drain electrode, and the third electrode of each being its gate electrode.

5. A combination as set forth in claim 3 including in said fast switch-off circuit:

a fourth terminal; and an auxiliary operating voltage connected between said first and fourth terminals.

6. A combination as set forth in claim 5 wherein said means for supplying source-to-drain voltage and load impedance for said first transistor comprises:

a fifth terminal;

a principal operating voltage supply connected between said first and fifth terminals; and a load, which exhibits said load impedance, connected between said second and fifth terminals.

7. A combination as set forth in claim 5 wherein said means, responsive to non-conduction between the first and second electrodes of said third transistor, for applying voltages exceeding said threshold values between the first and third electrodes of each of said second and fourth transistors comprises:

a third resistance having a first end connected to said fourth terminal and having a second end connected to the third electrode of said second transistor, the second electrode of said third transistor connecting to the second end of said third resistance; and a fourth resistance between the second end of said third resistance and the third electrode of said fourth transistor.

8. A combination as set forth in claim 7 wherein said means, responsive to the potential between said first and second terminals exceeding a prescribed value, for applying between the first and third electrodes of said fourth transistor a voltage sufficiently large to cause said fourth transistor to conduct between its first and second electrodes comprises:

a first diode conductive when the voltage thereacross exceeds a first specified value;

a first capacitor in series with said first diode between said second terminal and the third electrode of said fourth transistor;

a fifth resistance connected between said first terminal and the third electrode of said fourth transistor; and means for limiting the voltage difference between said first terminal and the third electrode of said fourth transistor when it tends substantially to exceed the value that renders said fourth transistor conductive between its first and second electrodes.

9. A combination as set forth in claim 8 wherein said means for limiting the voltage difference between said first terminal and the third electrode of said fourth transistor includes:

a second diode conductive when the voltage thereacross exceeds a second specified value, said second diode connected between said first terminal and the third electrode of said fourth transistor.

10. A combination as set forth in claim 9 wherein said second specified value differs from said first specified value and is smaller than said first specified value.

11. A combination as set forth in claim 8 wherein said means, responsive to said input drive signal being of a level for switching on conduction between the source and drain electrodes of said first transistor, for applying between the first and third electrodes of said third transistor a voltage sufficiently large to cause said third transistor to conduct between its first and second electrodes comprises:

a current rectifier diode, connected between said third terminal and the third electrode of said third transistor, said current rectifier diode being poled for conducting when said level for switching on said first transistor is applied to said third terminal and for not conducting when a level for switching off conduction between the source and drain electrodes of said first transistor is applied to said third terminal.

12. A combination as set forth in claim 11 wherein said means, responsive to non-conduction between the first and second electrodes of said fourth transistor, for applying between said first and third electrodes of said third transistor a voltage sufficiently large to cause said third transistor to conduct between its first and second electrodes comprises:

a sixth resistance having a first end connected to said fourth terminal and having a second end to which the second electrode of said fourth transistor is connected;

a seventh resistance connected between the second end of said sixth resistance and the third electrode of said third transistor; and a second capacitor connected between the second and of said sixth resistance and the third electrode of said third transistor.

13. A combination as set forth in claim 3 wherein said means, responsive to said input drive signal being of a level for switching on conduction between the source and drain electrodes of said first transistor, for applying between the first and third electrodes of said third transistor a voltage sufficiently large to cause said third transistor to conduct between its first and second electrodes comprises:

a current rectifier diode, connected between said third terminal and the third electrode of said third transistor, said current rectifier diode being poled for conducting when said level for switching on said first transistor is applied to said third terminal and for not conducting when a level for switching off conduction between the source and drain electrodes of said first transistor is applied to said third terminal.

14. A combination as set forth in claim 3 wherein said means, responsive to the potential between said first and second terminals exceeding a prescribed value, for applying between the first and third electrodes of said fourth transistor a voltage sufficiently large to cause said fourth transistor to conduct between its first and second electrodes comprises:

a first diode conductive when the voltage thereacross exceeds a first specified value;

a first capacitor in series with said first diode between said second terminal and the third electrode of said fourth transistor;

a fifth resistance connected between said first terminal and the third electrode of said fourth resistor; and means for limiting the voltage difference between said first terminal and the third electrode of said fourth transistor when it tends substantially to exceed the value that renders said fourth transistor conductive between its first and second electrodes.

15. In combination:

a first transistor which is of conductivity modulated field effect type and has source, drain and gate electrodes;

a first terminal to which the source electrode of said first transistor connects;

a second terminal to which the drain electrode of said first transistor connects;

a third terminal between which third terminal and said first terminal is applied an input drive signal voltage having a switch-on level and a switch-off level;

a first resistance connected between said third terminal and the gate electrode of said first transistor through which said input drive signal is applied to said first transistor gate electrode, to cause conduction between the source and drain electrodes of said first transistor responsive to said switch-on level and to cause non-conduction between the source and drain electrodes of said first transistor responsive to said switch-off level;

means for supplying source-to-drain voltage and load impedance for said first transistor, which means is connected between said first and second terminals;

a fourth terminal;

an auxiliary operating voltage supply connected between said first and fourth terminals;

second, third and fourth transistors, each having a respective principal current conduction path between a respective first electrode thereof and a respective second electrode thereof, the conductance of which principal current conduction path is controlled responsive to voltage applied between the first electrode of that transistor and a third electrode thereof exceeding a threshold value;

connections of the first electrodes of said second, third and fourth transistors to said first terminal;

a second resistance connected between the gate electrode of said first transistor and the second electrode of said second transistor;

a third resistance having a first end connected to said fourth terminal and having a second end connected to the third electrode of said second transistor, the second electrode of said third transistor connecting to the second end of said third resistance; and a fourth resistance connected between the second end of said third resistance and the third electrode of said fourth transistor;

a first avalanche diode and a first capacitor in series connection between said second terminal and the third electrode of said fourth transistor;

a second avalanche diode and a fifth resistance each connected between said first terminal and the third electrode of said fourth transistor;

a sixth resistance having a first end connected to said fourth terminal and having a second end to which the second electrode of said fourth transistor is connected;

a seventh resistance connected between the second end of said sixth resistance and the third electrode of said third transistor;

a second capacitor connected between the second end of said sixth resistance and the third electrode of said third transistor;

a current rectifier device connected between said third terminal and the third electrode of said third transistor, poled for conducting the switch-on level of said input drive signal voltage and for not conducting the switch-off level of said input drive signal voltage; and an eighth resistance connected between said first terminal and the third electrode of said third transistor.

16. A combination as set forth in claim 15 wherein said means for supplying source-to-drain voltage and load impedance for said first transistor comprises:

a fifth terminal;

a principal operating voltage supply connected between said first and fifth terminals; and a load, which exhibits said load impedance, connected between said second and fifth terminals.

17. A combination as set forth in claim 15 wherein each of said second, third and fourth transistors is of enhancement-mode field effect type, its first electrode being a respective source electrode thereof, its second electrode being a respective drain electrode thereof, and its third electrode being a respective gate electrode thereof.

18. A combination as set forth in claim 3 wherein each of said second, third and fourth transistors is of enhancement-mode field effect type, its first electrode being a respective source electrode thereof, its second electrode being a respective drain electrode thereof, and its third electrode being a respective gate electrode thereof.

* * * * *